United States Patent
Jo et al.

(10) Patent No.: US 7,496,008 B2
(45) Date of Patent: Feb. 24, 2009

(54) APPARATUS FOR REMOVING OFFSET OF PHASE LOCKED LOOP CIRCUIT AND METHOD THEREOF

(75) Inventors: Sang-hyun Jo, Seoul (KR); Seung-hoon Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 693 days.

(21) Appl. No.: 10/892,208

(22) Filed: Jul. 16, 2004

(65) Prior Publication Data
US 2005/0024153 A1    Feb. 3, 2005

(30) Foreign Application Priority Data
Jul. 28, 2003   (KR)  .................. 10-2003-0052092

(51) Int. Cl.
*G11B 7/00*   (2006.01)
(52) U.S. Cl. ............... 369/47.18; 369/44.32; 369/53.35
(58) Field of Classification Search ............. 369/59.27, 369/59.22, 59.2, 59.19, 47.48, 47.46, 47.28, 369/47.2, 59.11, 47.1, 47.17, 47.18, 53.33, 369/53.35, 44.32
See application file for complete search history.

(56) References Cited

U.S. PATENT DOCUMENTS 6,876,616 B2 *   4/2005   Tonami .................... 369/59.17

FOREIGN PATENT DOCUMENTS

| JP | 63-014377 | 1/1988 |
|----|-----------|--------|
| JP | 11-191270 | 7/1999 |
| KR | 1999-610913 | 7/1999 |

* cited by examiner

*Primary Examiner*—Nabil Z Hindi
(74) *Attorney, Agent, or Firm*—Staas & Halsey LLP

(57) ABSTRACT

An apparatus and a method removing offset of a Phase Lock Loop (PLL) circuit in a disc drive without using a disc when data playback is performed, the apparatus including an ENDEC module and a PLL circuit. The ENDEC module outputs a binary signal if an offset removal mode is set. The PLL circuit removes the offset of the PLL circuit by comparing a phase of the binary signal with a phase of a channel bit clock signal. Therefore, a time to remove the offset of the PLL circuit is reduced and the possibility not to remove the offset of the PLL circuit due to a damaged disc is prevented.

27 Claims, 3 Drawing Sheets

APPARATUS FOR REMOVING OFFSET OF PHASE LOCKED LOOP CIRCUIT AND METHOD THEREOF

CROSS-REFERENCE TO RELATED APPLICATION

This application claims the priority of Korean patent application No. 2003-52092, filed on Jul. 28, 2003, in the Korean Intellectual Property Office, the disclosure of which is incorporated herein entirety by reference.

BACKGROUND OF THE INVENTION

1. Field of the Invention

The present invention relates to an apparatus and a method of removing an offset of a PLL (Phase Locked Loop) circuit, and more particularly, to an apparatus and a method of removing an offset of a PLL circuit, used in a disc drive when data playback is performed.

2. Description of the Related Art

A PLL circuit of a disc drive generates a reference clock signal when performing data playback. Therefore, the PLL circuit of the disc drive must work in synchronization with a playback RF signal. However, before the PLL circuit of the disc drive synchronizes with the playback RF signal, an offset of the PLL circuit must be removed in order to increase accuracy of the reference clock signal output from the PLL circuit.

In a conventional method, the offset of the PLL circuit is removed using an RF signal generated by a test disc. Therefore, it takes a long time to remove the offset of the PLL circuit since the test disc is first inserted in the disc drive and an RF signal is obtained from the test disc.

Also, since the same test disc is used repeatedly in order to remove the offset of the PLL circuit, the test disc can become damaged. When the damaged test disc is used to remove the offset of the PLL circuit, an offset removal procedure of the PLL circuit may fail. If the offset removal procedure of the PLL circuit fails, playback data quality deteriorates since errors are contained in the generated clock signal.

SUMMARY OF THE INVENTION

According to an aspect of the present invention, there is provided an apparatus and a method of removing an offset of a PLL (Phase Locked Loop) circuit in a disc drive without using a test disc.

According to an aspect of the present invention, there is also provided an apparatus and a method of removing an offset of a PLL circuit without using an RF (Radio Frequency) signal obtained from a test disc when playback is performed.

According to an aspect of the present invention, there is also provided an apparatus and a method of removing an offset of a PLL circuit using a binary signal generated from an Encoder-Decoder (ENDEC) module.

According to an aspect of the present invention, there is provided an apparatus removing an offset of a Phase Look Loop (PLL) circuit in a disc drive, including: an Encoder-Decoder (ENDEC) module outputting a binary signal when an offset removal mode is set; and a PLL circuit removing the offset of the PLL circuit by comparing a phase of the binary signal with a phase of a channel bit clock signal.

According to another aspect of the present invention, there is provided an apparatus for removing an offset of a PLL circuit in a disc drive, including: an RF amplifier amplifying an RF signal obtained from a disc loaded in the disc drive; an ENDEC module outputting a binary signal when an offset removal mode is set; a PLL circuit removing the offset of the PLL circuit using the random binary signal; and a switch setting a path so as to transmit the binary signal output from the ENDEC module to the PLL circuit when the offset removal mode is set, and the signal output from the RF amplifier to the PLL circuit when the offset removal mode is released.

According to another aspect of the present invention, there is provided a method of removing an offset of a PLL circuit, including: transmitting a binary signal output from the ENDEC module to the PLL circuit when the offset removal mode is set; and stopping transmission of the binary signal output from the ENDEC module to the PLL circuit when the offset of the PLL circuit is removed.

Additional aspects and/or advantages of the invention will be set forth in part in the description which follows and, in part, will be obvious from the description, or may be learned by practice of the invention.

BRIEF DESCRIPTION OF THE DRAWINGS

The above and/or other features and advantages of the present invention will become more apparent by describing in detail exemplary embodiments thereof with reference to the attached drawings in which.

DETAILED DESCRIPTION OF THE EMBODIMENTS

Figure 1:
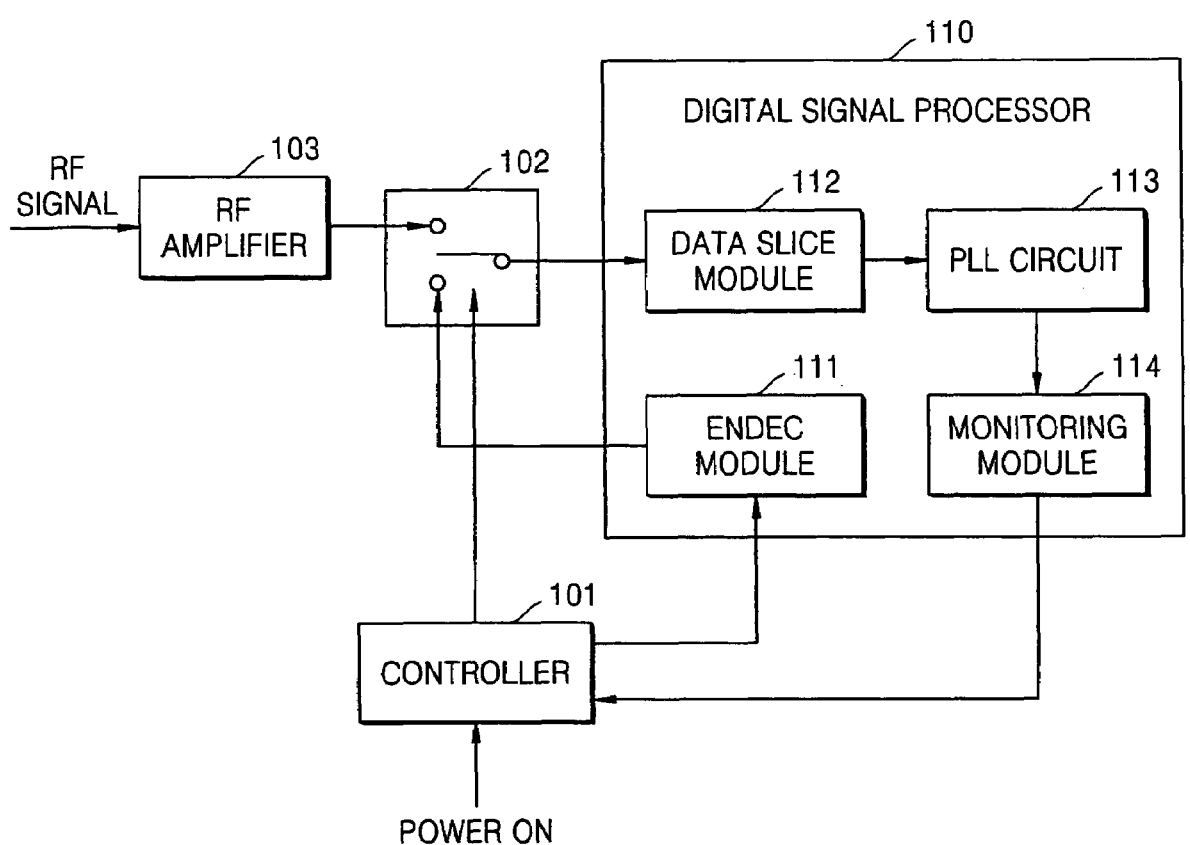
FIG. 1 is a functional block diagram of an apparatus removing an offset of a PLL circuit, according to an embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

FIG. 1 is a functional block diagram of an apparatus removing an offset of a PLL circuit in a disc drive, according to an embodiment of the present invention. With reference to FIG. 1, the apparatus includes a controller 101, a switch 102, an RF amplifier 103, and a DSP (Digital Signal Processor) 110. The DSP 110 includes an ENDEC module 111, a data slice module 112, a PLL circuit 113, and a monitoring module 114.

The controller 101 controls a function of the disc drive. When the disc drive is turned on, the controller 101 determines that an offset removal mode of the PLL circuit 113 is set. Also, if the monitoring module 114 informs the controller 101 that an offset of the PLL circuit 113 is removed, the controller 101 determines that the offset removal mode of the PLL circuit 113 is released. Whenever the controller 101 determines that the offset removal mode of the PLL circuit 113 is set or released, the controller 101 controls operation of the switch 102 and the ENDEC module 111.

If the offset removal mode of the PLL circuit 113 is set, the controller 101 controls the switch 102, which selects a signal output from the ENDEC module 111, and transmits the signal to the data slice module 112. However, if the offset removal mode of the PLL circuit 113 is released, the controller 101 controls the switch 102, which selects an RF signal output from the RF amplifier 103, and transmits the signal to the data slice module 112. The switch 102 may be a multiplexer.

If an RF signal obtained from a disc (not shown) is input to the RF amplifier 103, the RF amplifier 103 amplifies the RF signal to a predetermined value and outputs an amplified RF signal. The amplified RF signal is an analog signal. The amplified RF signal is transmitted to the switch 102.

If the offset removal mode of the PLL circuit 113 is set, the ENDEC module 111 is controlled by the controller 101 and outputs a binary signal. The binary signal is an EFM (Eight to Fourteen Modulation) signal. Also, the binary signal is represented by randomized marks and spaces. The binary signal may be a signal self-generated from the ENDEC module 111 or supplied from a host (not shown). An example of the signal self-generated from the ENDEC module 111 is a signal generated to control a write power.

Figure 2:
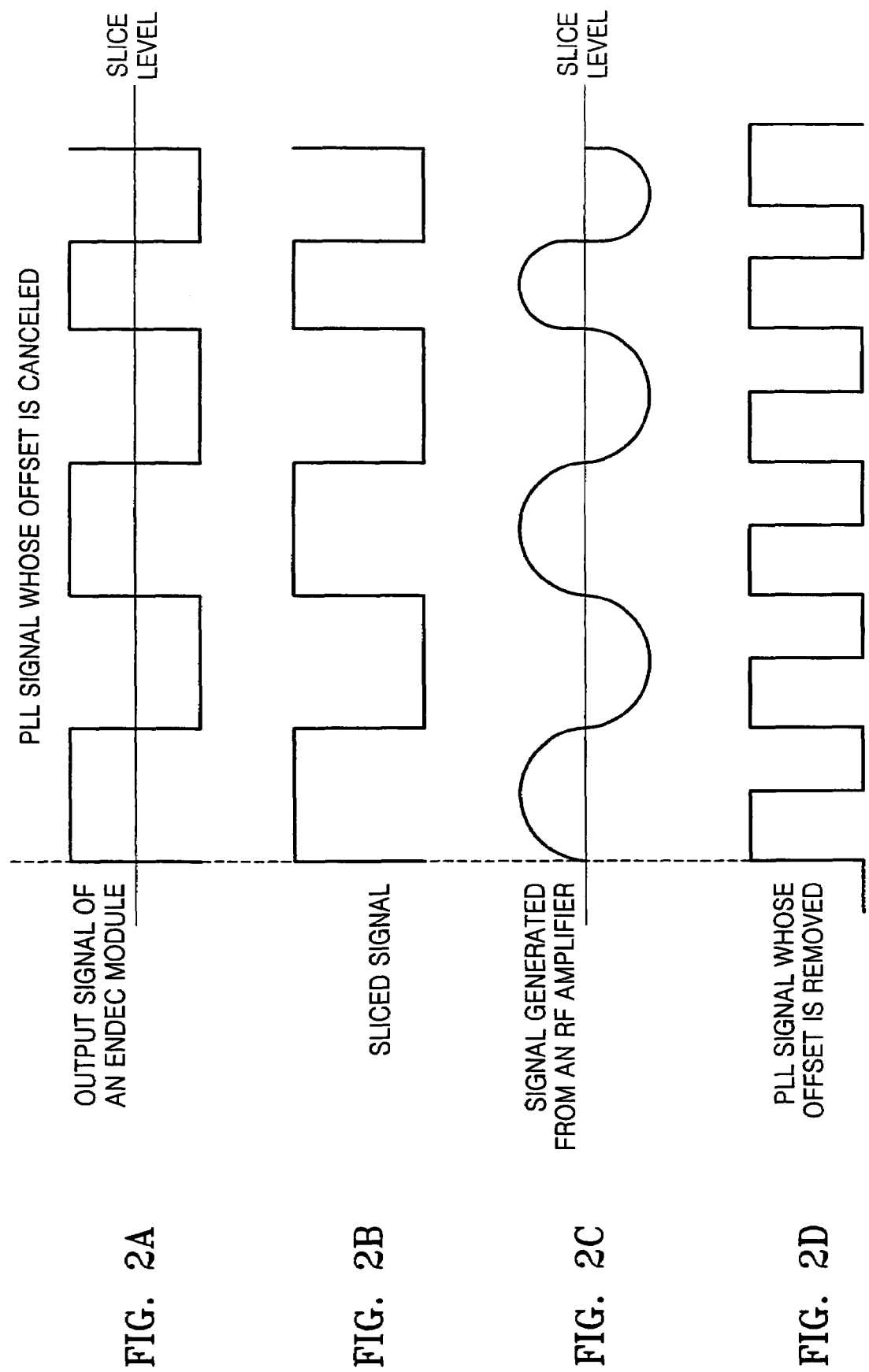
FIGS. 2A-2D are operation timing graphs of the apparatus removing the offset of the PLL circuit shown in FIG. 1, according to an embodiment of the present invention.

The data slice module 112 performs waveform shaping of the signal output from the switch 102 and outputs the result of the waveform shaping to the PLL circuit 113 as a digital EFM signal. Therefore, if the binary signal output from the ENDEC module 111 is input to the data slice module 112, the input signal and output signal of the data slice module 112 are the same, such as shown in FIGS. 2A and 2B. FIG. 2A shows the binary signal output from the ENDEC module 111, and FIG. 2B shows the output signal of the data slice module 112. Therefore, if the offset removal mode of the PLL circuit 113 is set, an offset is not generated in the data slice module 112.

However, if the offset removal mode of the PLL circuit 113 is released, since the RF signal output from the RF amplifier 103 is input to the data slice module 112, the input signal and output signal of the data slice module 112 are not the same, such as shown in FIGS. 2C and 2D. The reason for this is that the RF signal output from the RF amplifier 103 is an analog signal. Likewise, if the input signal format and output signal format of the data slice module 112 are different, an offset is generated from the data slice module 112, and the sliced signal shown in FIG. 2B may be changed into a waveform including the generated offset (not shown).

If the offset removal mode of the PLL circuit 113 is set, the PLL circuit 113 removes the offset of the PLL circuit 113 by comparing a phase of the sliced signal output from the data slice module 112 with a phase of a channel bit clock signal. The sliced signal is the binary signal output from the ENDEC module 111. The channel bit clock signal is a signal output from a VCO (Voltage Controlled Oscillator, not shown) included in the PLL circuit 113.

The monitoring module 114 judges whether the offset of the PLL circuit 113 is removed, on the basis of the channel bit clock signal output from the PLL circuit 113. That is, if the channel bit clock signal level and the output signal level of the PLL circuit 113 go high simultaneously, the monitoring module 114 determines that the offset of the PLL circuit 113 (or the PLL) is removed. Therefore, if the offset of the PLL circuit 113 is removed, the channel bit clock signal of the PLL circuit 113, such as the signal shown in FIG. 2D, is output to the monitoring module 114, and the monitoring module 114 informs the controller 101 that the offset of the PLL circuit 113 is removed.

Figure 3:
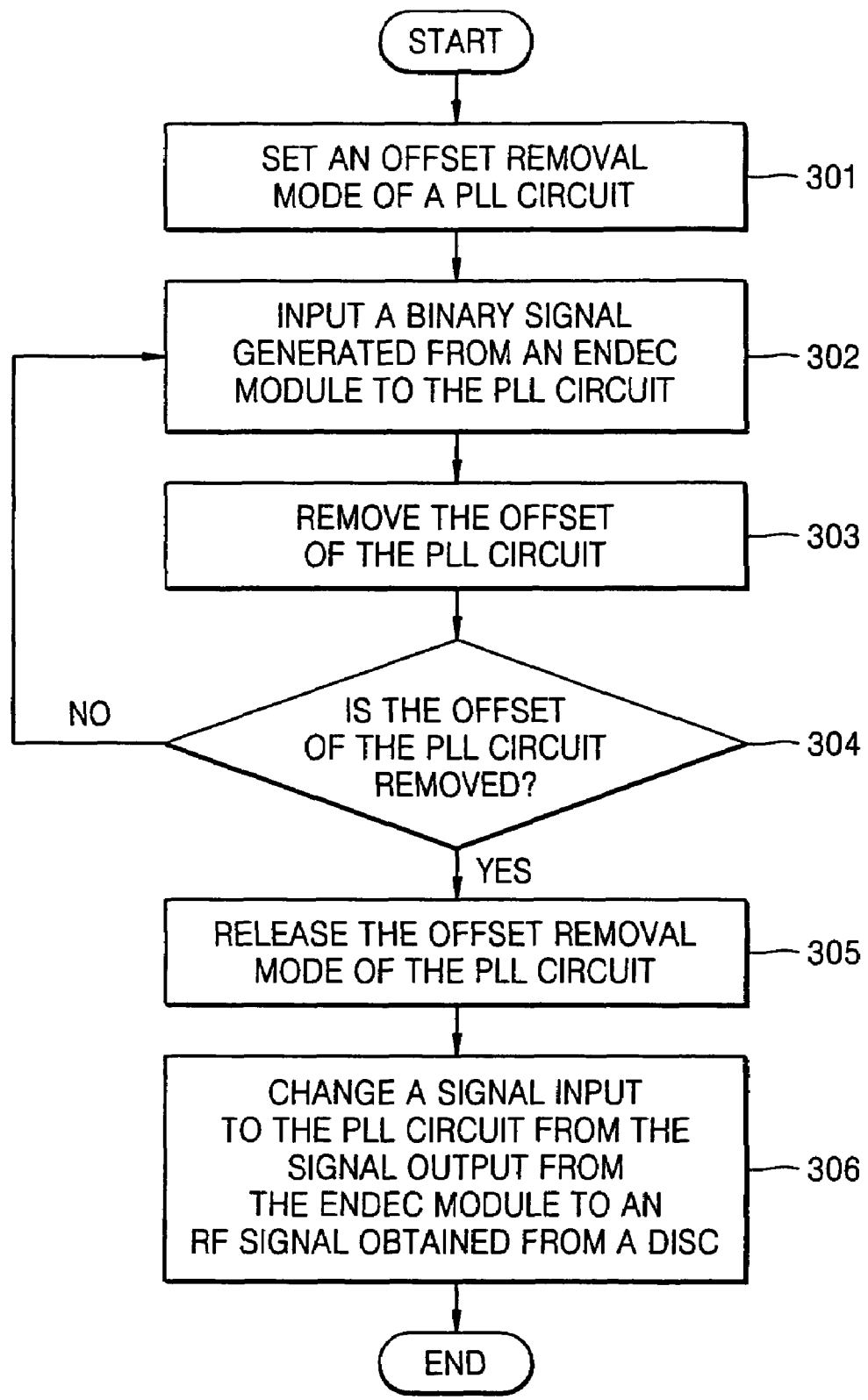
FIG. 3 is a flow chart of a method of removing an offset of a PLL circuit, according to an embodiment of the present invention.

FIG. 3 is a flow chart of a method of removing an offset of the PLL circuit 113, according to an embodiment of the present invention.

When the disc drive is turned on, an offset removal mode of the PLL circuit 113 is set in operation 301. A binary signal output from the ENDEC module 111 is input to the PLL circuit 113 in operation 302. At this time, the binary signal output from the ENDEC module 111 may be input to the PLL circuit 113 via the data slice module 112. The binary signal has the characteristics described in FIG. 1.

The offset of the PLL circuit 113 is removed in operation 303 by comparing a phase of the binary signal with a phase of the channel bit clock signal generated from the PLL circuit 113.

It is determined whether offset of the PLL circuit 113 is removed in operation 304. If the offset of the PLL circuit 113 is not removed in operation 304, the binary signal output from the ENDEC module is input to the PLL circuit by returning to operation 302.

However, if the offset of the PLL circuit 113 is removed in operation 304, an offset removal mode of the PLL circuit 113 is reset in operation 305.

Then, in operation 306, the signal input to the PLL circuit 113 is changed from the binary signal output from the ENDEC module 111 to an RF signal obtained from a disc (not shown). That is, if the offset of the PLL circuit 113 is removed, the binary signal output from the ENDEC module 111 is not transmitted to the PLL circuit 113.

As described above, the present invention removes the offset of the PLL circuit without using a disc.

Also, since an RF signal obtained from the disc is not used, when a disc drive is turned on, the offset of the PLL circuit is removed without regard to adjustment procedures necessary for RF signal playback, such as a read-in time. Furthermore, time necessary for removing the offset of the PLL circuit is reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus removing an offset of a Phase Lock Loop (PLL) circuit in a disc drive without using a signal from a disc, the apparatus comprising:
   an Encoder-Decoder (ENDEC) module outputting a binary signal when an offset removal mode is set; and
   the PLL circuit removing the offset of the PLL circuit by comparing a phase of the binary signal output by the ENDEC module with a phase of a channel bit clock signal.

2. The apparatus of claim 1, wherein the binary signal is an eight to fourteen modulation (EFM) signal.

3. The apparatus of claim 2, wherein the EFM signal consists of randomized marks and spaces.

4. The apparatus of claim 1, wherein the offset removal mode is set when the disc drive is turned on.

5. An apparatus removing an offset of a Phase Lock Loop (PLL) circuit in a disc drive, comprising:
   an RF amplifier amplifying an RF signal obtained from a disc loaded in the disc drive and outputting an amplified RF signal;
   an Encoder-Decoder (ENDEC) module outputting a binary signal when an offset removal mode is set;
   the PLL circuit removing the offset of the PLL circuit using the binary signal output from the ENDEC module; and
   a switch transmitting the binary signal output from the ENDEC module to the PLL circuit when the offset removal mode is set, and the switch transmitting the amplified RF signal output from the RF amplifier to the PLL circuit when the offset removal mode is released.

6. The apparatus of claim 5, further comprising:
a data slice module performing waveform shaping of a signal transmitted from the switch and outputting a result of the waveform shaping to the PLL circuit as a digital eight to fourteen modulation (EFM) signal.

7. The apparatus of claim 5, wherein the binary signal is an eight to fourteen modulation (EFM) signal.

8. The apparatus of claim 7, wherein the EFM signal consists of randomized marks and spaces.

9. The apparatus of claim 5, wherein the PLL circuit removes the offset of the PLL circuit by comparing the binary signal output from the ENDEC module with a channel bit clock signal generated from the PLL circuit.

10. The apparatus of claim 9, further comprising:
a monitoring module determining whether the offset of the PLL circuit is removed by monitoring the channel bit clock signal output from the PLL circuit; and
a controller controlling operation of the switch and the ENDEC module based on a result determined in the monitoring module.

11. The apparatus of claim 10, wherein the controller determines that the offset removal mode is set when the disc drive is turned on and controls operation of the switch and the ENDEC module according to the determined result, and if the monitoring module informs the controller that the offset of the PLL circuit is removed, the controller determines that the offset removal mode is released and controls operation of the switch and the ENDEC module.

12. A method of removing an offset of a (Phase Lock Loop) PLL circuit in a disc drive having an Encoder-Decoder (ENDEC) module, without using a signal from a disc, the method comprising:
transmitting a binary signal output from the ENDEC module to the PLL circuit when an offset removal mode is set; and
stopping the binary signal transmission output from the ENDEC module to the PLL Circuit when the offset of the PLL circuit is removed.

13. The method of claim 12, wherein the binary signal is an eight to fourteen modulation (EFM) signal.

14. The method of claim 13, wherein the EFM signal consists of randomized marks and spaces.

15. The method of claim 12, further comprising:
controlling operation of the disc drive so that an RF signal from a disc loaded in the disc drive is transmitted to the PLL circuit after stopping the binary signal transmission to the PLL circuit.

16. The apparatus of claim 1, wherein the binary signal is self-generated from the ENDEC module or supplied from a host.

17. The apparatus of claim 16, wherein the self-generated binary signal is a write power control signal.

18. The apparatus of claim 5, wherein the binary signal is self-generated from the ENDEC module or supplied from a host.

19. The apparatus of claim 18, wherein the self-generated binary signal is a write power control signal.

20. The method of claim 12, wherein the binary signal is self-generated from the ENDEC module or supplied from a host.

21. The method of claim 20, wherein the self-generated binary signal is a write power control signal.

22. The apparatus of claim 1, wherein the channel bit clock signal is output from a Voltage Controlled Oscillator (VCO) on the PLL circuit.

23. The apparatus of claim 9, wherein the channel bit clock signal is output from a Voltage Controlled Oscillator (VCO) on the PLL circuit.

24. An apparatus removing an offset of a Phase Lock Loop (PLL) circuit without using a signal from a disc, the apparatus comprising:
a controller setting an offset removal mode of the PLL circuit;
an encoder-decoder (ENDEC) outputting a binary signal; and
a processor removing the offset of the PLL circuit by comparing a phase of the binary signal output by the ENDEC with a phase of a channel bit clock signal output by the processor.

25. A method of removing an offset of a (Phase Lock Loop) PLL circuit in a disc drive, the method comprising:
setting an offset removal mode of the PLL circuit;
inputting a binary data signal generated from an Encoder-Decoder (ENDEC) to the PLL circuit;
removing the offset of the PLL circuit by comparing a phase of the binary data signal With a phase of a channel bit clock signal;
releasing the offset removal mode of the PLL circuit; and
inputting an RF signal obtained from a disc to the PLL circuit.

26. An apparatus removing an offset of a Phase Lock Loop (PLL) circuit, the apparatus comprising:
a controller setting an offset removal mode of the PLL circuit;
an encoder-decoder (ENDEC) outputting a binary signal; and
a processor removing the offset of the PLL circuit by comparing a phase of the binary signal output by the ENDEC with a phase of a channel bit clock signal output by the processor, wherein the apparatus removes the offset of the PLL circuit without using a disc.

27. A method of removing an offset of a (Phase Lock Loop) PLL circuit in a disc drive, the method comprising:
setting an offset removal mode of the PLL circuit;
inputting a binary data signal generated from an Encoder-Decoder (ENDEC) to the PLL circuit; and
removing the offset of the PLL circuit by comparing a phase of the binary data signal with a phase of a channel bit clock signal without using a disc.

* * * * *